US008675894B2

(12) United States Patent
Ayres

(10) Patent No.: US 8,675,894 B2
(45) Date of Patent: Mar. 18, 2014

(54) AUDIO CONSOLE SYSTEM

(75) Inventor: Richard Ayres, Stevenage (GB)

(73) Assignee: Harman International Industries Ltd., Hertfordshire (GB)

( * ) Notice: Subject to any disclaimer, the term of this patent is extended or adjusted under 35 U.S.C. 154(b) by 539 days.

(21) Appl. No.: 12/912,322

(22) Filed: Oct. 26, 2010

(65) Prior Publication Data

US 2011/0096943 A1 Apr. 28, 2011

(30) Foreign Application Priority Data

Oct. 27, 2009 (EP) .................................. 09174143

(51) Int. Cl.
*H03G 3/00* (2006.01)
*H03F 99/00* (2009.01)
(52) U.S. Cl.
USPC ............ 381/107; 381/104; 381/119; 381/120
(58) Field of Classification Search
USPC .................. 381/104, 107, 119–120
See application file for complete search history.

(56) References Cited

U.S. PATENT DOCUMENTS

| 4,357,492 | A | * | 11/1982 | Campbell et al. ............. 381/107 |
| 4,737,735 | A | | 4/1988 | Kampes |
| 5,802,186 | A | * | 9/1998 | Kubota ......................... 381/107 |
| 2007/0160237 | A1 | | 7/2007 | Hibino et al. |
| 2008/0056514 | A1 | * | 3/2008 | Ito et al. ....................... 381/119 |
| 2008/0177552 | A1 | * | 7/2008 | Poimboeuf et al. .......... 704/500 |
| 2008/0219477 | A1 | * | 9/2008 | Aiso et al. .................... 381/119 |
| 2011/0069846 | A1 | * | 3/2011 | Cheng et al. ................... 381/92 |

FOREIGN PATENT DOCUMENTS

JP 2004-056342 A 2/2004

OTHER PUBLICATIONS

European Search Report for European Application No. EP 09 17 4173.9 dated May 25, 2010; 6 pages.

* cited by examiner

*Primary Examiner* — Ahmad Matar
*Assistant Examiner* — Katherine Faley
(74) *Attorney, Agent, or Firm* — Brooks Kushman P.C.

(57) ABSTRACT

An audio console system includes an input for receiving an audio signal. The system may also include a user adjustable input amplifier which may amplify audio signals received from the input with a predefined gain. The system may additionally include a direct out output amplifier provided after the adjustable input amplifier. The direct out output amplifier may output a direct out output signal. The direct out output amplifier may adjust a gain of a signal transmitted from the adjustable input amplifier. The direct output amplifier may be configured in such a way, that, upon a user adjustment of the adjustable input amplifier, the direct out output amplifier may adjust the gain of the direct out output signal inversely to the adjustment of the input amplifier resulting in a predefined gain of the audio signal from the at least one input to the direct out output being maintained.

21 Claims, 10 Drawing Sheets

AUDIO CONSOLE SYSTEM

BACKGROUND OF THE INVENTION

1. Priority Claim

This application claims the benefit of priority from European Patent Application No. 09 174 143.9, filed Oct. 27, 2009, which is incorporated by reference.

2. Technical Field

This invention relates to an audio console processing audio signals, a console system with a master console and a slave console, and methods for processing an audio signal, as well as any similar apparatus performing a similar function.

3. Related Art

With the increasing use of digital consoles there is a growing request for multiple mixing consoles to share a single microphone (input) amplifier. In the analogue domain the solution was typically achieved with an analogue splitting system distributing multiple instances of the source signal to an independent microphone amplifier in each console. The analogue splitting system may be employed in an application using digital consoles, but this is considered inefficient use of the equipment. A more efficient system may be achieved if a single microphone amplifier is shared, but this also may cause conflict, as many audio engineers or operators may be uncomfortable and concerned that one operator could increase or decrease the microphone amplifier gain and affect the levels and mixes on other consoles or equipment within the system. It is desirable to reduce system costs through elimination of duplicated hardware components, reduced cost of infrastructure components such as cabling and trunking, and reduced cost of installation through fewer system components and simpler infrastructure. Given such demands, sharing common resources is increasingly important. Accordingly, a need exists to provide an audio console or similar system allowing the sharing of a single microphone amplifier.

SUMMARY

An audio system may include an audio console having at least one input receiving an audio signal. The audio console may also include an adjustable input amplifier that may amplify the audio signal received on the at least one input with a predefined gain when no user adjustment has been made. This predefined or default gain may be set or changed automatically or manually. A direct out output amplifier may be provided between the adjustable input amplifier and a direct out output. The direct out output amplifier may adjust the gain of a signal received from the adjustable input amplifier. The direct out output may output a direct out output signal, received from the direct out output amplifier, from the audio console. The direct out output amplifier may be configured so that, upon an adjustment or modification of the adjustable input amplifier, the direct out output amplifier may automatically adjust the gain of the direct out output signal inversely to the adjustment of the input amplifier. This adjustment may be done so that the predefined gain between the at least one input and the direct out output is maintained. This may lead to a constant gain of the audio signal from the at least one input to the direct out output. Accordingly, when the user adjusts the gain of the adjustable input amplifier, an amplitude of the audio signal provided at the direct out output may be automatically adjusted the substantially opposite number of dB, thereby keeping the system gain and therefore the amplitude of the audio signal from the source of the audio signal to the direct out output unchanged.

The console system processing audio signals may include a master console and a slave console. The master console may be configured with a direct out output amplifier that inversely adjusts the gain in dependence on the adjustment of the adjustable input amplifier. The slave console may include a source input connected to the direct out output of the master console, such that the slave console may share the received audio signal. Where the direct output amplifier inversely adjusts the gain in dependence on the adjustment of the adjustable input amplifier, the slave console may not have to pay attention to whether the gain of the input audio signal was adjusted.

The slave console may include an output connected to an additional input of the master console. The master console may include an additional output. The transmission paths of the signal from the additional input to the additional output of the master console may be configured such that no further processing of the audio signal is carried out. Alternatively, additional processing of the signal as received from the slave console may be carried out before the received signal is output from the master console.

A hub may be provided for the system. The hub may be connected to an output of the master console. The hub may be connected between the master console and one or more of slave consoles. In these arrangements, multiple splits of the direct out output signal may be achieved.

This system may be used with digital audio mixing consoles. The system may also be applied to audio processing devices that may include configurable digital signal processors, where no actual mixing is carried out.

Other systems, methods, features and advantages will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The system may be better understood with reference to the following drawings and description. The components in the figures are not necessarily to scale, emphasis instead being placed upon illustrating the principles of the invention. Moreover, in the figures, like referenced numerals designate corresponding parts throughout the different views.

DETAILED DESCRIPTION OF THE PREFERRED EMBODIMENTS

A system may incorporate multiple microphone amplifiers that may be accessed independently by different mixing consoles. However, this may be expensive. Alternatively, a system may involve detecting changes to the gain of a console A by a console B by applying the inverse gain change to console B's digital trim, resulting in a net "no change" to the level in the console B. However, in such a system, console A needs to communicate with console B. This means that console B has to be able to understand console A, which may require the two consoles to be supplied by a common supplier.

Figure 1:
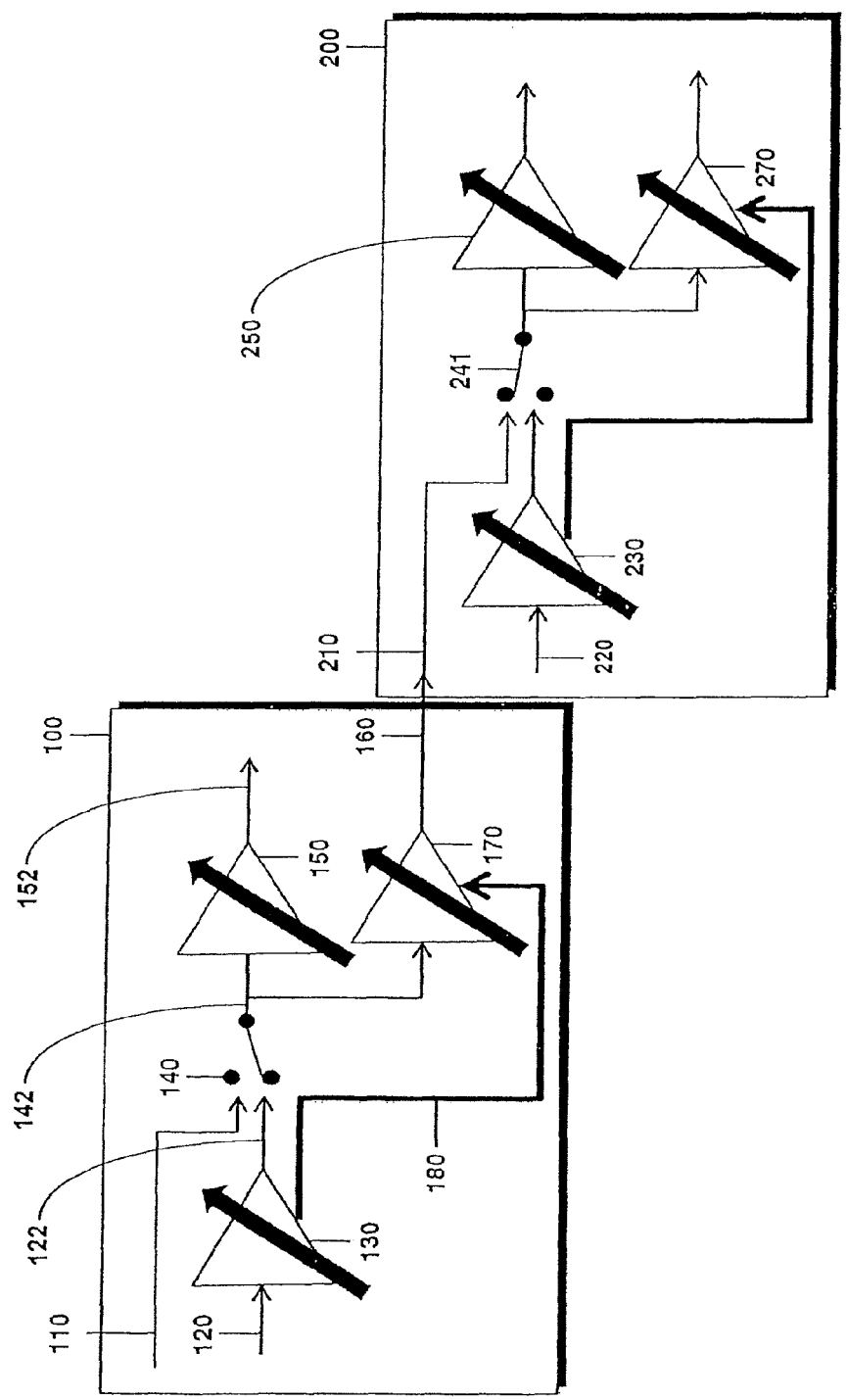
FIG. 1 is a schematic view of an example of the basic architecture of a console system.

FIG. 1 is an example of a console system that includes a master console 100 and a slave console 200. The console system may be used to keep the gain of the direct out output signal constant. The console system may feed the direct out output signal to one channel of a second console system.

The master console 100 may be any audio mixing board or audio console, including a mixing board or audio console for processing audio. For example, the master console 100 may be a mixing board or other audio console used in controlling one or more audio inputs or outputs for an entertainment event such as a play, musical, concert, sporting event, or other event. Alternatively, the master console 100 may be partially or fully integrated or incorporated into a computer or processor. The slave console 200 may be any mixing board or audio console, including any audio console for processing audio signals or a mixing console. The master console 100 may have control over the processing of the audio signals. Alternatively, the slave console 200 may be partially or fully integrated or incorporated into a computer or processor. The slave console 200 may share the output of the master console 100. The functionality of the master console 100 and/or the slave console 200 may be produced entirely by hardware, entirely by software, or any combination of hardware and software.

Figure 9:
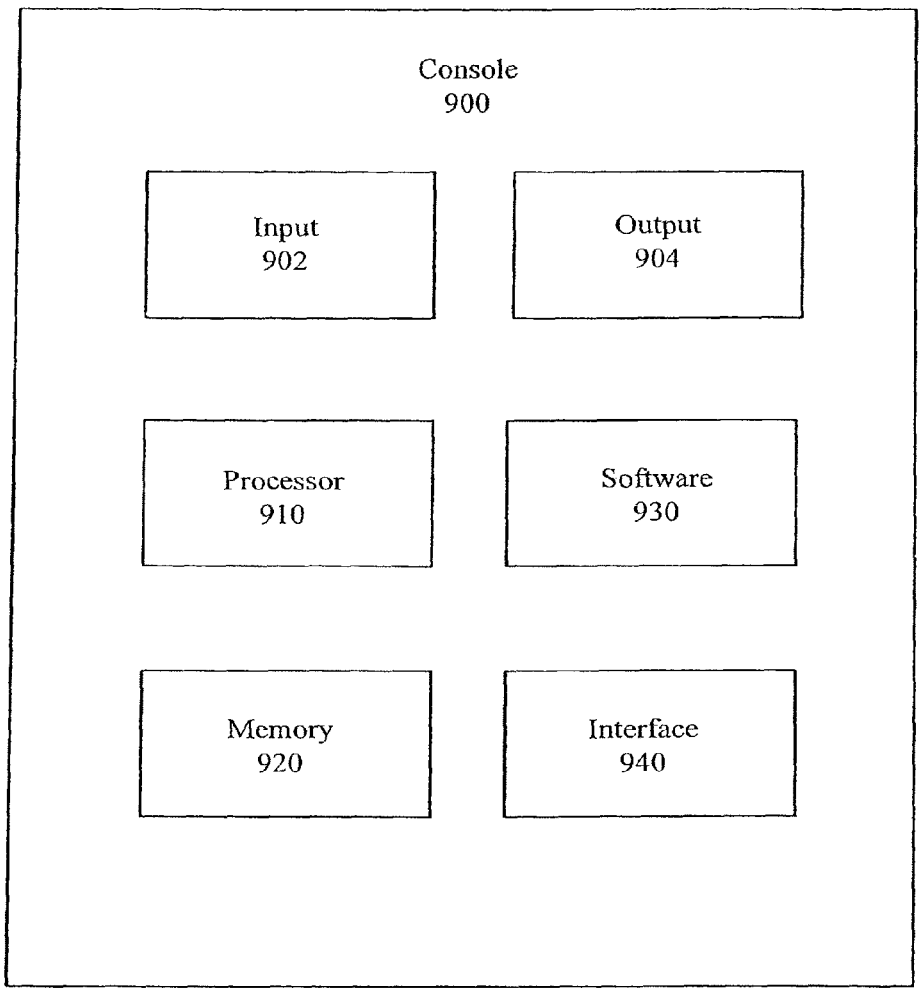
FIG. 9 is an example of a console including a processor, memory, software, an interface, an input, and an output.

FIG. 9 is one example of a console 900, such as master console 100 or a slave console 200. In addition to one or more inputs 902 and one or more outputs 904, a console 900 may include a processor 910, a memory 920, software 930, and an interface 940. The master console 100 or slave console 200 may include fewer or more features or elements as desired. The master console 100 and/or the slave console 200 may alternatively be completely or partially analogue consoles, and may or may not include a processor, memory, or software.

The processor 910 may be a component in any one of a variety of systems. For example, the processor 910 may be part of a personal computer or a workstation. In FIG. 9, the processor 910 is incorporated into console 900, which may be a physical mixing board or any audio console. The processor 910 may be one or more general processors, digital signal processors, application specific integrated circuits, field programmable gate arrays, servers, networks, digital circuits, analog circuits, combinations thereof, or other now known or later developed devices for analyzing and processing digital and analogue data. The processor 910 may operate in conjunction with a software program, such as code generated manually (i.e., programmed).

The processor 910 may be coupled with memory 920, or memory 920 may be a separate component. Software 930 may be stored in memory 920. Memory 920 may include, but is not limited to, computer readable storage media such as various types of volatile and non-volatile storage media, including random access memory, read-only memory, programmable read-only memory, electrically programmable read-only memory, electrically erasable read-only memory, flash memory, magnetic tape or disk, optical media and the like. The memory 920 may include a random access memory for the processor. Alternatively, the memory 920 may be separate from the processor, such as a cache memory of a processor, the system memory, or other memory. The memory may be an external storage device or database for storing recorded data. Examples include a hard drive, compact disc ("CD"), digital video disc ("DVD"), memory card, memory stick, floppy disc, universal serial bus ("USB") memory device, or any other device operative to store data. The memory 920 may be operable to store instructions executable by the processor.

The console 900 may have an interface 940. The interface 940 may include knobs, switches, sliding components, buttons, a mouse, keyboard, touch screen or other devices or mechanisms capable of receiving user inputs for adjusting, modifying or controlling one or more features of the console 900. The interface 940 may be used to manipulate one or more characteristics, components, or features of the console 900. For example, the console 900 may include a knob which, when turned, modifies the volume for one or more of the received signals processed by the console, or modifies the gain applied by one or more amplifiers in the console 900.

The functions, acts, tasks, and/or components described herein may be performed or represented by a programmed processor executing instructions stored in memory. The functions, acts or tasks may be independent of the particular type of instruction set, storage media, processor or processing strategy and may be performed by software, hardware, integrated circuits, firm-ware, micro-code and the like, operating alone or in combination. Likewise, processing strategies may include multiprocessing, multitasking, parallel processing and the like. A processor may be configured to execute the software.

In FIG. 1, the master console 100 may have one or more inputs, such as inputs 110 and 120. The master console 100 may have an adjustable input amplifier 130 and a direct out output amplifier 170. The master console 100 may have a direct out output 160, where a direct out output signal provided by a direct out output amplifier 170 may be output from the master console 100. The master console 100 may also have an amplifier 150. Inputs 110 and 120 may receive different channels of audio signals. Inputs 110 and 120 may receive one or more audio signals from one or more audio sources. Inputs 110 and 120 may receive digital audio signals or analogue audio signals. If an analogue audio signal is received, an analog-to-digital converter may be used to obtain a digital signal. Although the master console 100 in FIG. 1 only shows inputs 110 and 120, adjustable input amplifier 130, amplifier 150, and direct out output amplifier 170, the master console 100 can have any number of inputs, adjustable input amplifiers, amplifiers, and direct out output amplifiers.

The master console 100 may receive an input signal at input 110. The input signal received at input 110 may be a raw signal from a line or digital source, such as a keyboard, synthesizer, mixing board, computer, audio console, or other digital source. The master console 100 may also receive an input signal at input 120. The input signal received at input 120 may include signals from a microphone or other analogue source. The input signal received at input 120 may be transmitted, sent, passed, or otherwise communicated to the adjustable input amplifier 130 which may receive the input signal.

The adjustable input amplifier 130 may be a microphone amplifier or other amplifier, such as any device that changes the amplitude of a signal and provides an amplified output on an amplified output line 122. The relationship of the input to the output of an amplifier—usually expressed as a function of the input frequency—may be called the transfer function of the amplifier. The magnitude of the transfer function may be termed the gain. As used herein amplifying refers to increasing or decreasing the amplitude of the signal, or passing or transmitting the signal through the amplifier without changing the amplitude of the signal when the gain of the amplifier is set to unity, or 1.

In the figures, the diagonal arrow through adjustable input amplifier 130, like the diagonal arrows through amplifier 150 and direct out output amplifier 170, indicates that the gain of the adjustable input amplifier 130 can be adjusted. The gain of the adjustable input amplifier 130 may be adjusted automatically or manually adjusted. The gain of the amplifier 150 and the gain of the direct out output amplifier 170 also can be adjusted automatically or manually.

Figure 10:
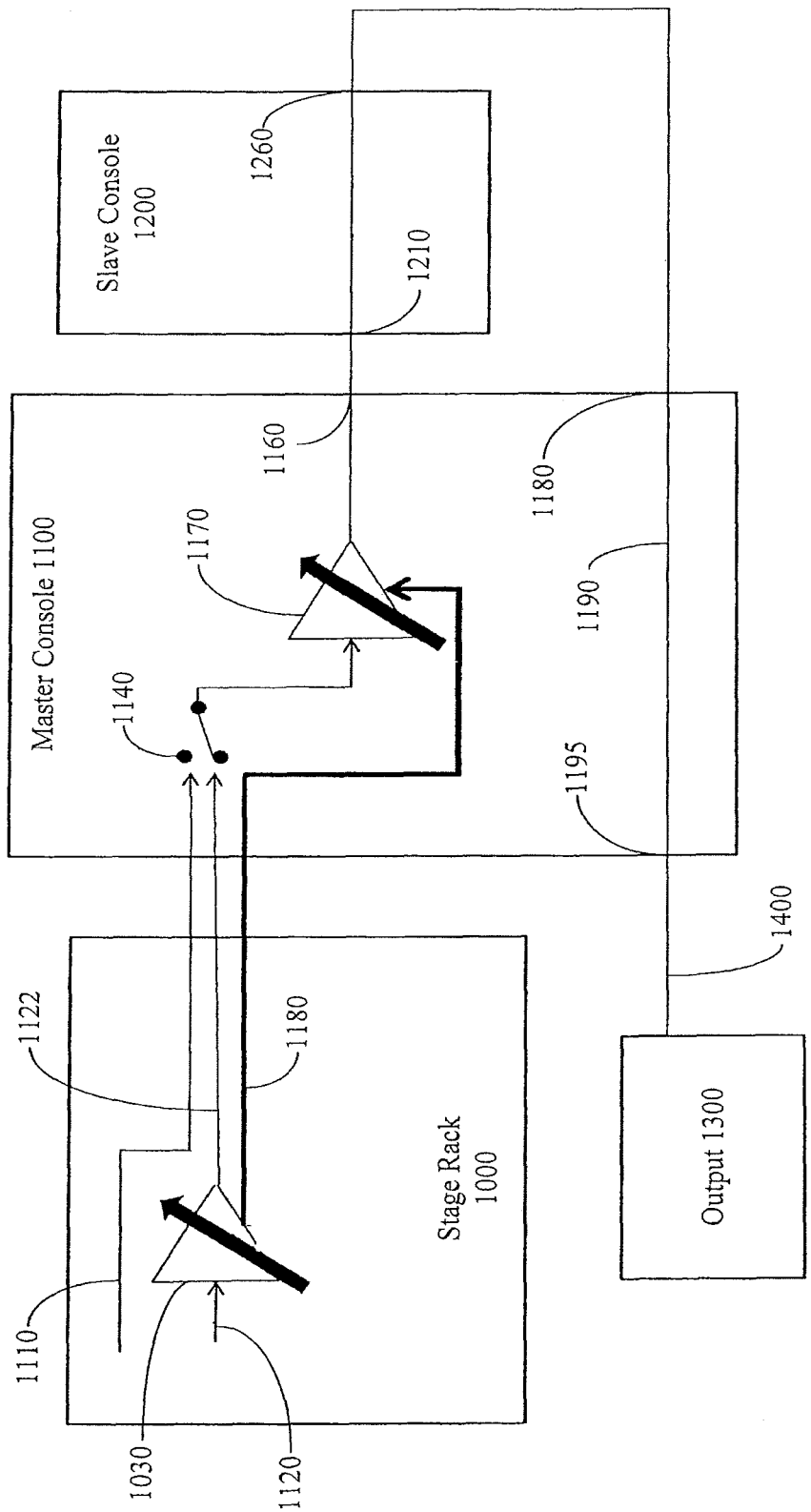
FIG. 10 is a schematic view of an example console system.

The adjustable input amplifier 130 may be located inside the master console 100 or may be provided remote of the master console 100. For example, the adjustable input amplifier 130 may be a part of a stage rack, as shown in FIG. 10.

The input signal received at input 120, as shown in FIG. 1, may be in the range of mV and may be amplified in the adjustable input amplifier 130 by a predefined or default amount. The predefined or default amplification may be adjusted automatically or manually by a user of the master console 100. For example, a user may physically turn a knob, flip or slide a switch, push a button, click a mouse, provide data input into a computer, or otherwise interact with the amplifier 130 to modify the amplification of the adjustable input amplifier 130. The gain may be increased or decreased relative to the predefined gain. Without user interaction or other automatic or manual adjustments, the adjustable input amplifier 130 may amplify the signal received with a predetermined gain.

A source select switch 140 may be provided with the master console 100. The source select switch 140 may selectively transmit the amplified signal output on the amplified output line 142 from the adjustable input amplifier 130 or the line signal received at input 110 to the direct out output amplifier 170, or to the amplifier 150, or to both the direct out output amplifier 170 and the amplifier 150. The signal selected by the source select switch may be transmitted on an amplified output line 142. The source select switch 140 may be a physical switch or circuitry, or may be encoded and controlled through or with the use of a processor. The direct out output amplifier 170 may be any amplifier or other device that changes the amplitude of an input signal. The amplifier 150 may be any amplifier or other device that changes the amplitude of a signal.

At the amplifier 150, a digital gain adjustment may be carried out after an analogue-to-digital conversion if the signal on the amplified input line 142 is an analogue signal. Alternatively, if the signal is digital, the analogue to digital conversion can be omitted. From there, the signals may be transmitted to the processing channels on an amplified output signal line 152. The processing channels may be used for processing the signals transmitted on the amplified output signal line 152. Such processing may include, for example, equalization, filtering, compression, expansion, or other processing of the signal, and/or mixing of the signal with other signals. The processing channels may exist in the master console 100 or may be transmitted by the amplified output signal line 152 to other audio consoles or mixing boards.

In the master console 100, a direct out output 160 may be provided. The direct out output 160 may be a listening point within the channel path before the amplified analogue signal is mixed with other audio signals. The direct out output 160 may be provided prior of any kind of processing of the amplified audio signal, such as equalization, filtering, compression, expansion, or any other processing of the signal, and/or mixing of the signal with other signals.

The direct out output amplifier 170 may be a point where the gain of the signal output from the adjustable input amplifier 130 may be controlled, amplified, attenuated, or otherwise modified. The direct out output amplifier 170 may directly or indirectly receive the amplified signal from the adjustable input amplifier 130. The direct out output amplifier 170 may amplify the received signal. The direct out output amplifier 170 may be directly or indirectly connected to the direct out output 160 and may output the amplified or attenuated signal to the direct out output 160.

The direct out output 160 may represent the earliest or first point on the signal chain after the direct out output amplifier 170. The direct out output amplifier 170 may represent the earliest or first point on the signal chain after the adjustable input amplifier 130. The signal chain may begin at the input 110 or 120 with the input of a raw signal, such as at the input 110 or 120 to the master console 100. The signal chain between the input 110 or 120 and the digital out output 160 may consist of only the adjustable input amplifier 130, the digital out output amplifier 170, and the transmission paths between the inputs 110 or 120, the adjustable input amplifier 130, the digital out output amplifier 170, and the digital out output 160. As such, the digital out output 160 may output a signal which has not been processed at all, which has not been mixed with any other signals, and which has, at most, only been amplified or attenuated. Alternatively, the signal chain may include fewer or more features.

It may be desirable to maintain a constant system gain as measured from the input or source 120 to the direct out output 160. This constant system gain may be unity or one, or may be any other value. The system gain may be set by a default or user preference. The system gain may be modified automatically or manually. The direct out output amplifier 170 may operate, be configured, or be used to assure that the system gain remains constant over time as signals are received. In keeping the system gain substantially constant over time, the system may, for example, measure, monitor, identify, determine, and/or compare the signal strength at the input 110 or 120 and the direct out output 160. The system may also or instead measure, monitor, identify, determine, and/or compare the signal or signal characteristics such as voltage, current, and/or amplification at one or more points along the signal chain, such as by using voltage or current sensors. The system may also or instead measure, monitor, identify, determine, and/or compare the gains of the adjustable input amplifier 130 and the digital out output amplifier 170, or may use any other method, measurements, or calculations to keep the system gain substantially constant. The direct out output amplifier 170 may operate, be configured, or be used to substantially adjust for, reverse, counteract, and/or account for any changes or adjustments in the gain or amplification of the adjustable input amplifier 130 and/or the overall system gain, in order to assure a constant system gain between source 120 and direct out output 160. Accordingly, the term "substantially" refers to minimizing amplification or attenuation of the signal at the direct out output with respect to the predetermined input amplifier gain to avoid a perceived change by a listener. The direct out output amplifier 170 may adjust the direct out output signal by amplifying or attenuating the audio signal.

The direct out output amplifier 170 may automatically react to any adjustment made to the adjustable input amplifier 130 or to the gain or amplification of the audio console. The direct out output amplifier 170 may monitor, such as through a connection, the gain and/or amplification of the adjustable input amplifier 130. Connection 180 may be, or may be a part of, a feed forward system, such as a feed forward system where the amplification, gain, and/or change in amplification and/or gain of the adjustable input amplifier 130 is communicated to the direct out output amplifier 170. Information may be passed by the connection 180 through hardware or software logic, circuitry, any wired or wireless communication, or any other method of connection. For example, a measured change in the amplification of the adjustable input amplifier 130 may be communicated to the direct out output amplifier 170, which in turn adjusts its amplification a substantially opposite amount, to amplify the received signal inversely to the amplification provided by the adjustable input amplifier 130. In other examples, a gain value, a comparison of the input and the output of the adjustable input amplifier 130, or any other signal indicative of a change away from the predetermined gain of the adjustable input amplifier 130 may be provided to direct out output amplifier 170.

The direct out output amplifier 170 may monitor any adjustments made to the gain and/or amplification of the adjustable input amplifier 130. The direct out output amplifier 170 may monitor any adjustments made to the gain and/or amplification of the signal between the input 110 or 120 and the direct out output 160. The direct out output amplifier 170 may be controlled to adjust the gain of the direct out output signal so that the system gain measured from the source to the direct out output remains substantially unchanged. The direct out output amplifier 170 may monitor the gain adjustment of the adjustable input amplifier 130 and may automatically adjust the direct out output signal to minimize amplification or attenuation of the signal relative to the predetermined system gain at the direct out output 160.

The increase or decrease of the gain by the user at the adjustable input amplifier 130 may be substantially reversed at the direct out output amplifier 170 in order to obtain substantially the predefined gain at the direct out output amplifier 170. When a user adjusts the gain of the adjustable input amplifier 130 a first number of decibels (dB), the direct out output amplifier 170 may monitor or otherwise receive or understand the adjustment, and may automatically adjust the gain or amplification of the direct out output amplifier 170 substantially the opposite number of dB. The direct out output amplifier 170 receives the signal from the adjustable input amplifier 130, and applies the adjusted gain or amplification to the received signal. This may keep the system gain from the source of the audio signal to the direct out output 160 substantially unchanged. Received signals may be completely internally amplified and controlled by the master console 100, with no amplification information or adjustments being received from any other consoles. As such, any console receiving a signal output from the digital out output 160 may be assured that a constant gain has been applied to the signal throughout its transmission by the master console 100, without interference or input from other consoles.

The direct out output amplifier 170 may be configured so that its gain is set to unity if the adjustable input amplifier 130 is not adjusted by the user. When the adjustable input amplifier 130 is not adjusted, the direct out output amplifier 170 may not increase or decrease the signal strength of the received input signal.

The direct out output amplifier 170 may be the earliest point of the signal chain of the master console 100 after the audio signal is received as an input to the adjustable input amplifier 170. The direct out output signal output from the direct out output amplifier 170 may be output from the master console 100 as an external audio signal before the signal is mixed or processed to any other audio signal channel.

The adjustable input amplifier 130, the amplifier 150, and the digital out output amplifier 170 may be similar in construction or may be different. Any of the adjustable input amplifier 130, the amplifier 150, or the digital out output amplifier 170 may include a physical amplifier, circuitry, hardware, software, computer logic, computer instructions, or software encoded on a computer-readable medium.

The direct out output 160 may be connected to an analogue line or digital source input 210 of the slave console 200. As described, a gain adjustment made to the adjustable input amplifier 130 may not affect the levels of the audio signal at the other consoles such as the slave console 200. Such a gain adjustment may be made automatically, such as through the use of a processor, or manually, such as by a user or an operator. The direct out output amplifier 170 may ensure that all signals passing through the master console 100 from the source or inputs are output through the direct out output 160 with a substantially constant system gain.

Where the slave console 200 also receives an additional signal 220, such as a microphone signal or another analogue signal, the slave console 200 may also include an input amplifier 230 that may be similar to the adjustable input amplifier 130, an amplifier 250 that may be similar to the amplifier 150, and a direct out output amplifier 270 that may be similar to the direct out output amplifier 170 of the master console 100. The slave console 200 may also include a source select switch 241. In some arrangements, only the master console 100 may receive a microphone signal.

Figure 5:
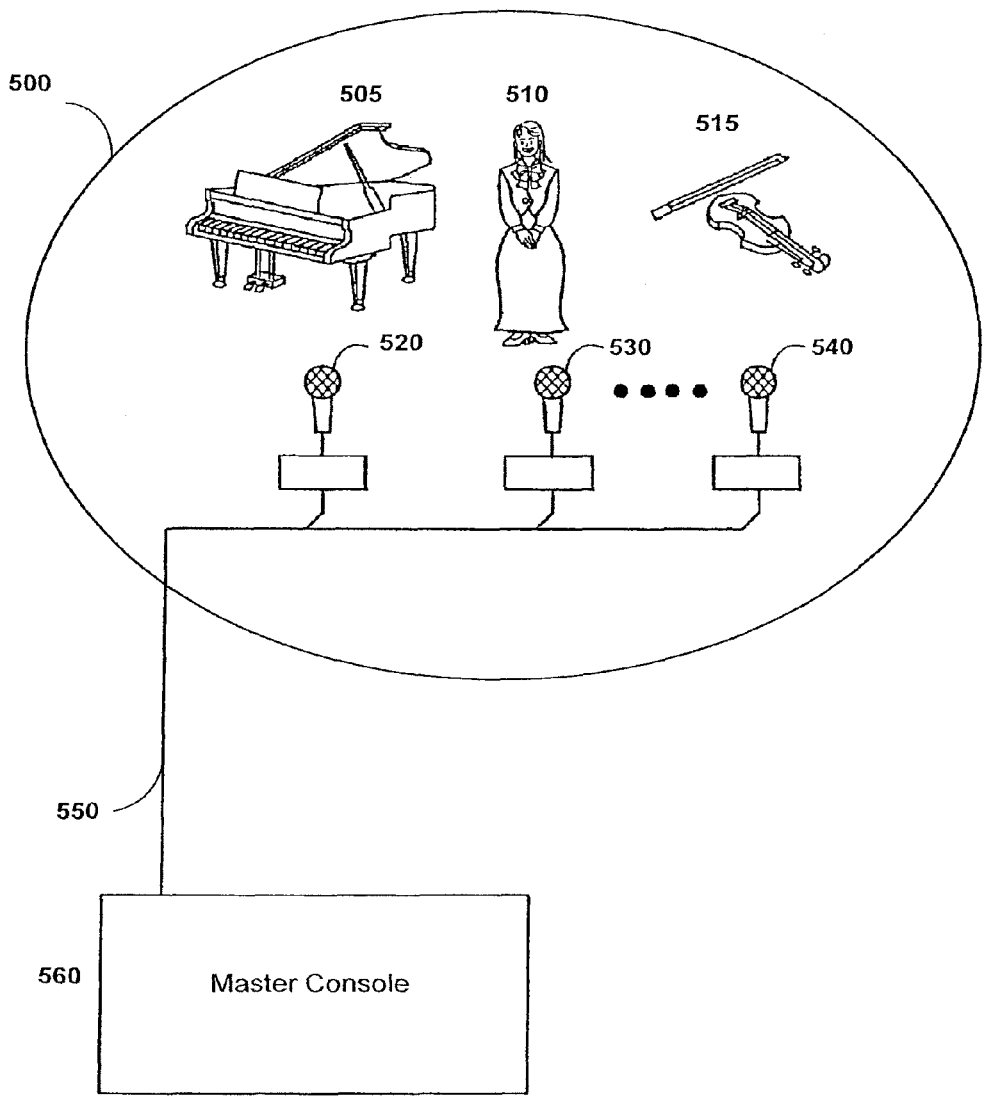
FIG. 5 is an example system where the master console is connected to inputs on a stage.

The signal take-off point for the direct out output amplifier 170 may be the earliest point in the signal chain after the adjustable input amplifier 130. This may be before the signal has been processed or mixed with any other signals. In the console system shown in FIG. 2, the master console 100 may receive a plurality of analogue inputs 110. This plurality of analogue inputs 110 may be received from sources from an area. For example, the analogue inputs 110 may be received from a plurality of microphones or other analogue sources at various points on a stage. FIG. 5 shows an example of a stage 500 with a plurality of audio sources such as a piano 505, a singer 510, or a violinist 515. Each of the microphones 520, 530, and 540 may pick up audible sound produced by the audio sources and generate representative analogue input signals that are provided to the master console 560 via one or more communication lines 550.

Figure 2:
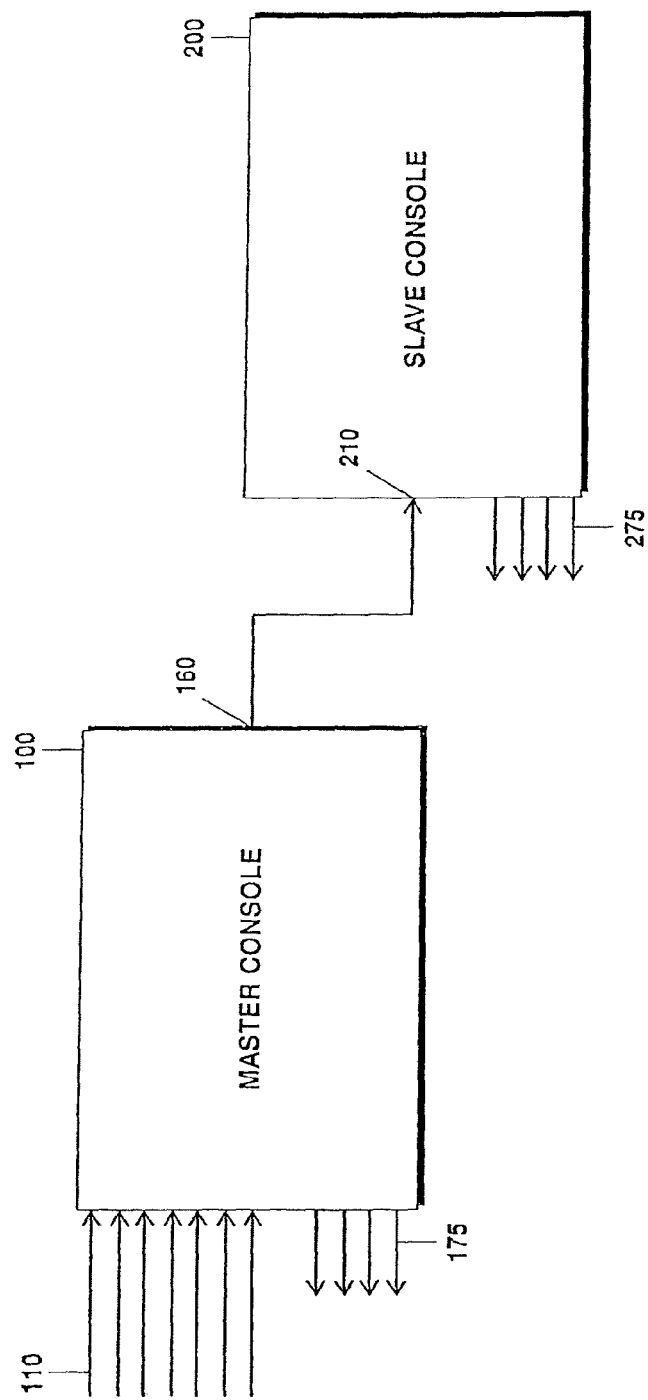
FIG. 2 is a macro schematic view of an example master console and slave console included in the console system.

In FIG. 2, one or a plurality of direct out outputs 160 may be connected to one or a plurality of line inputs 210. These connections may use a connection system capable of passing a plurality of channels. The slave console 200 may have additional outputs 275 that may go to the stage or to other units such as loudspeakers, amplifiers, or other equipment. The master console may have outputs 175 transmitting signals to stage or to loudspeakers or other equipment.

One or more adjustable input amplifiers 130 may be included in a master console 100. The one or more adjustable input amplifiers 130 may receive raw audio signals from one or more inputs 110, and may output amplified signals to one or more source select switches 140. The master console 100 may include one or more digital out output amplifiers 170 which may receive the one or more amplified signals from the one or more adjustable input amplifiers. Each one of these digital out output amplifiers 170 may monitor a corresponding one of the adjustable input amplifiers 130, and may adjust the gain applied by the digital out output amplifiers 170 as discussed. Association of the digital out output amplifiers 170 with a corresponding one of the adjustable input amplifiers 130 may be accomplished logically via software, via hardware, via switch settings, or any other mechanism. The master console 100 may output one or more amplified signals through one or more channels and one or more outputs.

Figure 3:
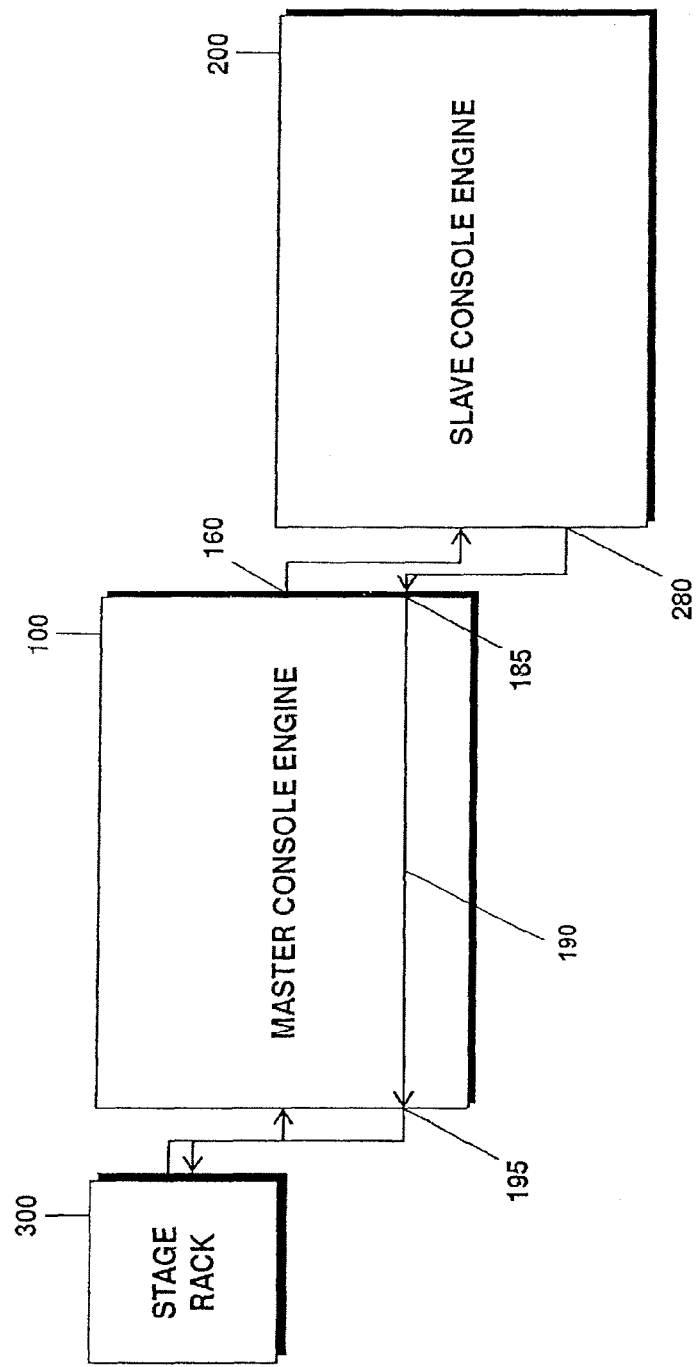
FIG. 3 is a schematic view of the console system shown in FIG. 2.

In FIG. 3, a console system is shown in which a stage rack 300 is provided. Additionally, in FIG. 3, the master console engine 100 and slave console engine 200 may represent features of one or more respective processors which may carry out the functions of a master console 100 and a slave console 200 respectively. The stage rack 300 may receive source signals from multiple points in an area such as a stage, and may provide multichannel links to the master console 100. The stage rack 300 may provide input and output points on stage.

In FIG. 1, one or more direct out output signals from the master console 100, which may be a multichannel direct out output signal that may be automatically adjusted as described above, may be received by the slave console 200 at the direct out output 160. Output 280 of the slave console may transmit one or more audio output signals to the master console 100 using input 185 and may be transmitted through an output 195 of the master console 100 back to the stage rack 300. The one or more output audio signals may be analogue signals or digital signals provided in a predetermined communication protocol, multiplexes, or otherwise communicated. A transmission path 190 may exist between the input 185 on the master console 100 and the output 195. The transmission path 190 may operate, be configured, or be used to pass signals received at the input 185 to the output 195 without processing the audio signals. The audio signals coming from the slave console 200 may be passed through the master console 100 from input 185 to output 195 without processing. Alternatively, the audio signals may be further processed in the master console 100 before being transmitted to the stage rack 300. The system in FIG. 3 may eliminate the need for any local input or output audio connections on or associated with the master or slave consoles. The system in FIG. 3 may also eliminate or partially eliminate a need for an analogue multi channel cabling system if multi channel digital links are used between stage rack 300 master console engine 100 and slave console 200.

The stage rack 300 may be the host equipment for the adjustable input amplifiers 130. Accordingly, the adjustable input amplifiers 130 may be absent from the master console 100. In FIG. 10, an example audio system is shown which includes a stage rack 1000, a master console 1100, a slave console 1200, and an output 1300. Stage rack 1000 may include inputs 1110 and 1120 and one or more adjustable input amplifiers, such as adjustable input amplifier 1030. The adjustable input amplifier 1030 may be similar and/or operate in a similar manner as adjustable input amplifier 130. Inputs 1110 and 1120 may be similar to inputs 110 and 120. The system may include input paths 1110, 1122, and 1180 from the stage rack 1000 to the master console 1100. The system may alternatively only one or more of the paths, such as paths 1122 and 1180. The input paths 1110, 1122, and/or 1180 may be individual lines from the stage rack 1000 to the master console 1100, or may all be sent together, such as over a multi-channel line. In the system in FIG. 10, the master console 1100 may not include an adjustable input amplifier 130. Master console 1100 may include a direct out output amplifier 1170, which may operate the same or similarly as the direct out output amplifier 170, and may operate so as to maintain a predetermined or unity gain between the inputs 1110 and 1120 and the direct out output 1160 as described. As shown in FIG. 10, the master console 1100 may include a source select switch 1140, which may operate in the same or a similar manner as the source select switch 140. Alternatively, the master console 1100 may not have a source select switch.

In FIG. 10, the direct out output signal may be output by the master console 1100 at the direct out output 1160, prior to any processing or mixing. The direct out output signal may be received at an input 1210 of the slave console 1200. The slave console 1200 may or may not include additional amplifiers or other processing equipment. The slave console 1200 may include a slave console output 1260, which may transmit a slave console output signal to a second input 1180 of the master console 1100. The slave console output signal received by the master console 1100 at the second input 1180 may be transmitted along a transmission path 1190, which may be similar to the transmission path 190, and may be output by the master console 1100 at a second output 1195 to the output 1300 along output path 1400. Output 1300 may be a monitor or other device for receiving an audio signal. Output 1300 may or may not be the stage rack 1000. Where the output 1300 is the stage rack 1000, the input paths 1110, 1122, and 1180 and the output path 1400 may represent or be included within the same transmission line. In this way, fewer connections between a stage rack 1000 and a master console 1100 may be achieved.

The master console 1100 may be configured or operable to receive one or more signals. The master console 1100 may have one or more channels which receive, through inputs 1110 or 1120, signals directly from the stage rack 1000 which are then transmitted to corresponding adjustable input amplifiers 1130 in the master console 1000 and handled as previously discussed. The master console 1100 may additionally or alternatively have one or more channels which receive input paths like 1110, 1122, and 1180 from a stage rack 1000 as described with respect to FIG. 10, and which do not include corresponding adjustable input amplifiers 1130. In this way, some signals may be received at the master console 1100 prior to having been passed through an adjustable input amplifier 1130, while other signals may be received from an adjustable input amplifier 1130 located in the stage rack.

Figure 4:
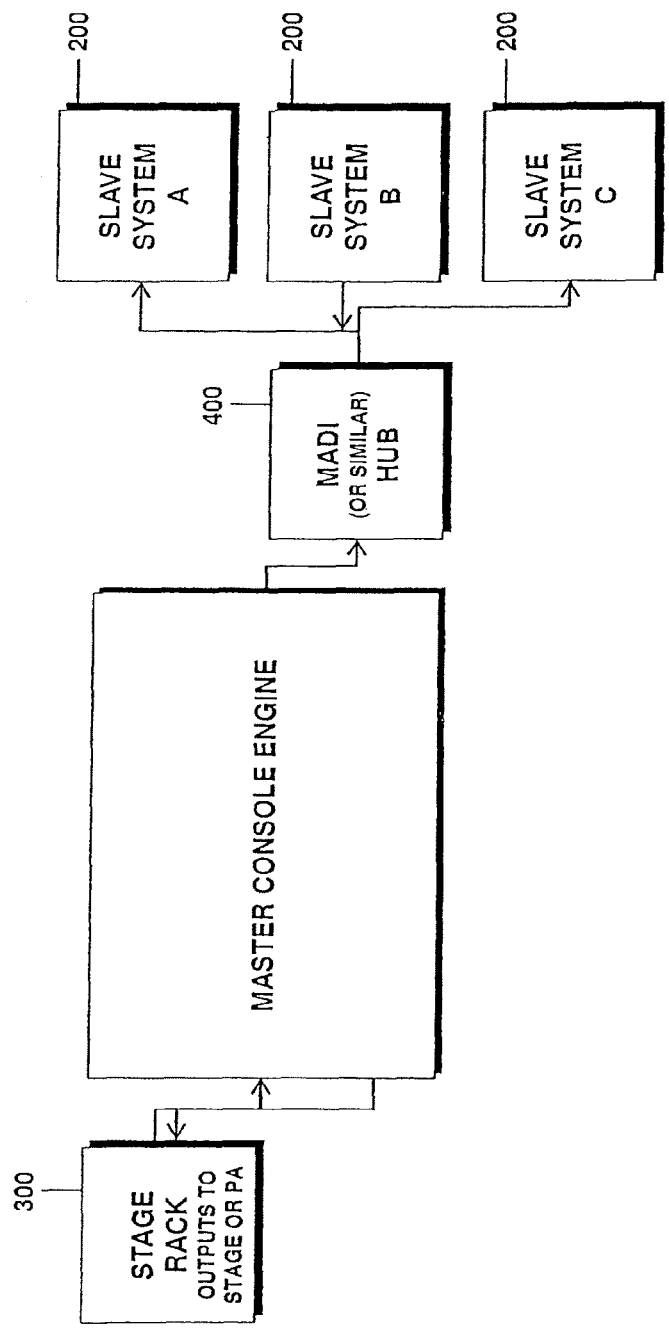
FIG. 4 is an example system in which the master console is connected via a hub to multiple slave consoles.

In FIG. 4 a system is shown with a hub 400. The hub 400 may be one or more of a Multichannel Audio Digital Interface (MADI) hub or any similar hub. The hub 400 may be a standardized communication protocol defining data formats and electrical characteristics of an interface carrying multiple channels of digital audio. Using the hub 400, multiple splits of the direct out output signals of the master console 100 may be provided to several slave consoles 200. The splits may also be created using slave consoles 200 daisy chained together with their inputs linked to outputs.

These systems may use a direct out output 160 from the master console 100 to stabilize the system rather than attempting to compensate for gain changes at the adjustable input amplifiers at the input of the slave console 200. The stabilized signal level from the master console 100 may be split or daisy chained an infinite number of times.

Figure 6:
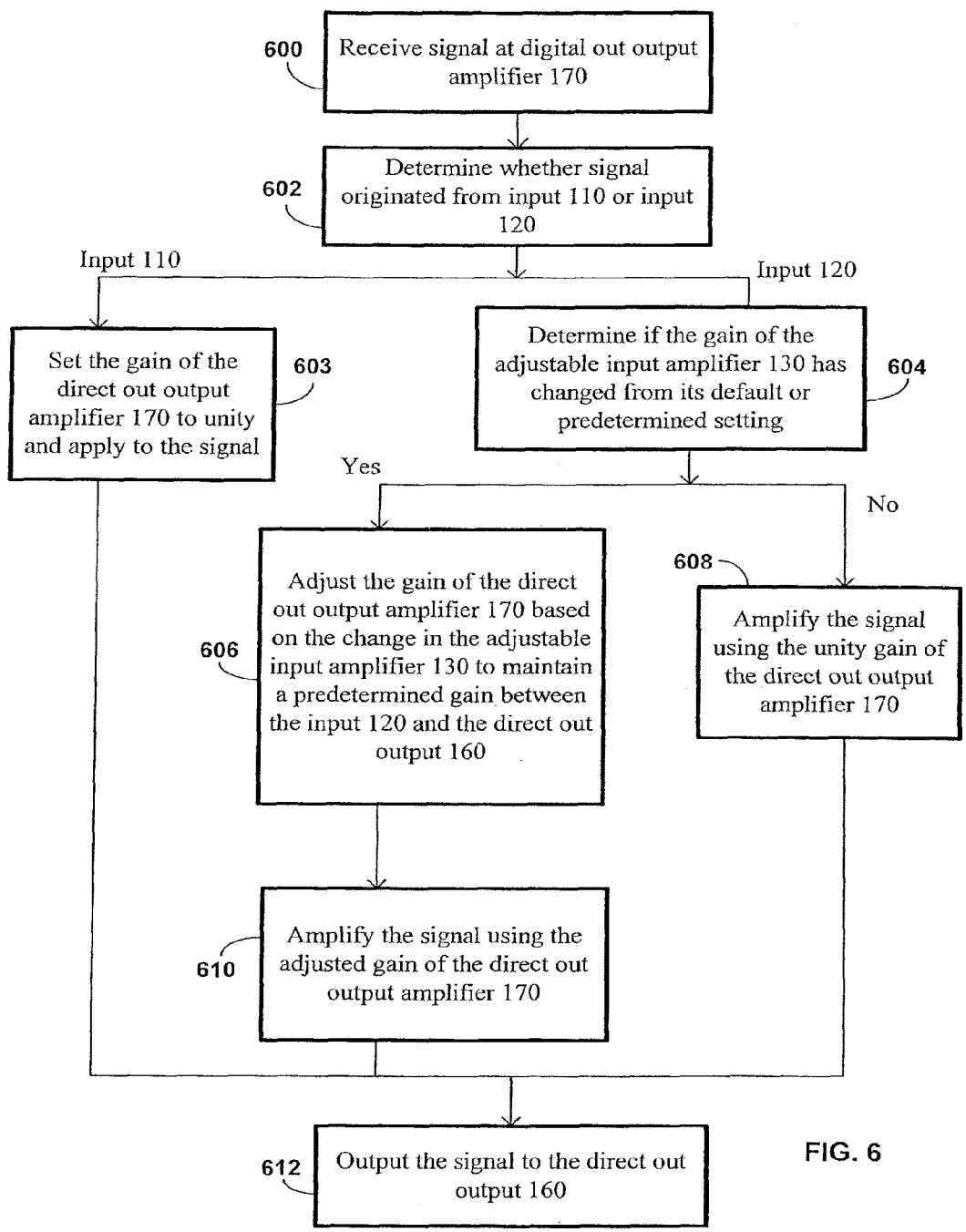
FIG. 6 is an example of a process that may take place at a digital out output amplifier.

FIG. 6 shows an example of a process that may take place at a digital out output amplifier 170. The example process begins at step 600, where an audio signal is received at the digital out output amplifier. This signal may, for example, be selectively transmitted to the digital out output amplifier 170 by the source select switch 140. At step 602, the digital out output amplifier 170 determines whether the received signal originated at input 110 or input 120. This determination may also involve determining whether the audio signal received was originally input into the master console 100 as a digital signal or an analogue signal. This determination may involve determining whether the signal received passed through the adjustable input amplifier 130. If the signal originated at input 110, the process proceeds to step 603, where the gain of the digital out output amplifier 170 is set to unity and applied to the signal, after which the process proceeds to step 612, where the digital out output amplifier outputs the signal to the direct out output 160. For signals originating at input 120, the process proceeds to step 604, where it is determined whether the gain of the adjustable input amplifier 130 has changed from its default or predetermined setting. If the gain of the adjustable input amplifier has changed, at step 606, the gain of the direct out output amplifier 170 is adjusted based on the change in the adjustable input amplifier 130, to substantially maintain a predetermined gain between the input 120 and the direct out output 160. For example, when a user adjusts the gain of the adjustable input amplifier 130 a first number of decibels (dB), the direct out output amplifier 170 may automatically adjust the gain or amplification of the direct out output amplifier 170 the opposite number of dB. At step 610, the signal received is amplified using the new adjusted gain of the direct out output amplifier 170. If, on the other hand, the gain adjustable input amplifier 130 was determined in step 604 not to have changed, then the signal is amplified using unity gain of the direct out output amplifier 170 at step 608. In either case, the amplified signal is output to the direct out output 160 at step 612.

Figure 7:
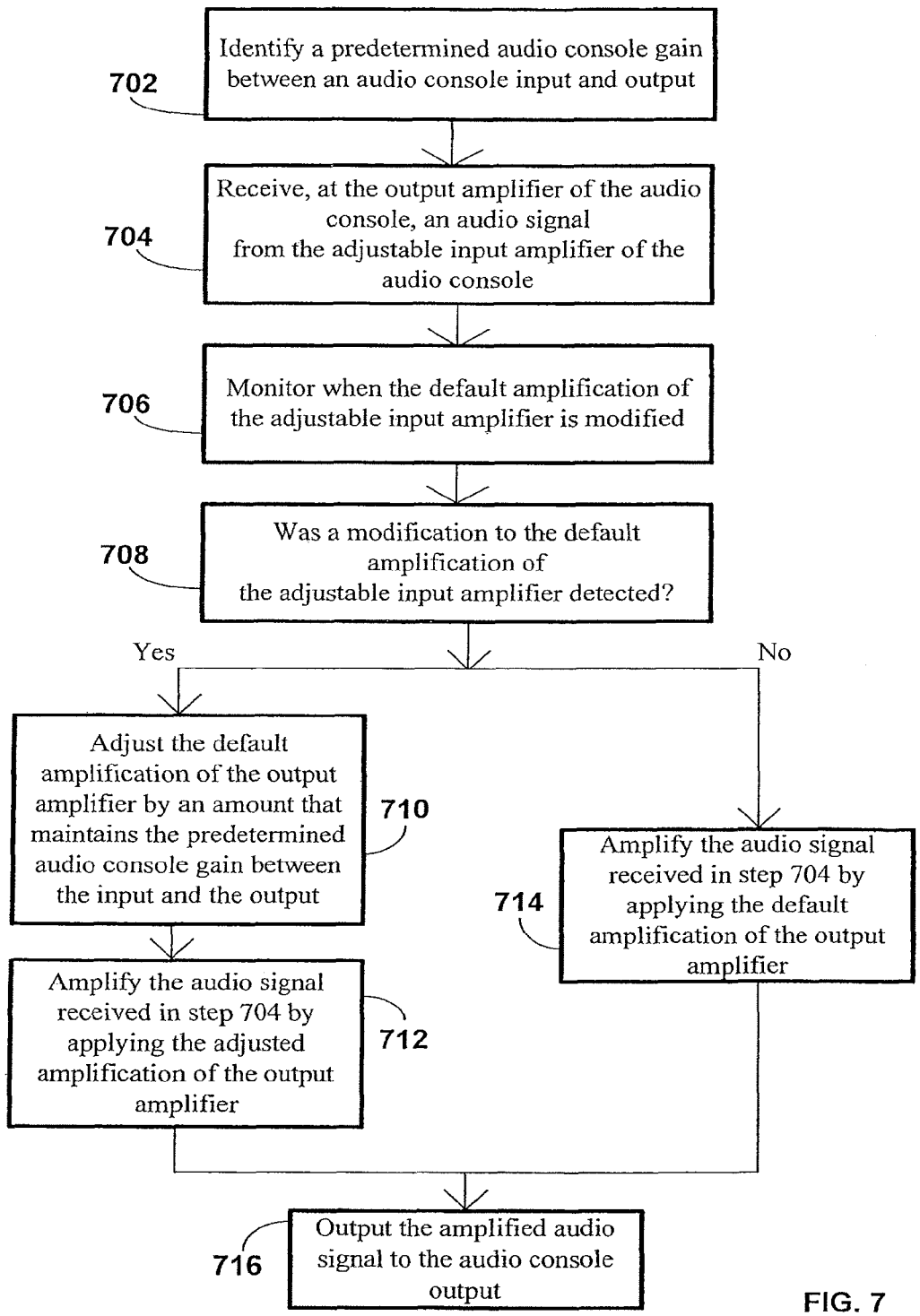
FIG. 7 is an example of how a system may perform output gain stabilization.

FIG. 7 is an example operation of a console system performing output gain stabilization. The process may begin at step 702, where a predetermined audio console gain between an input and an output may be identified. At step 704, an audio signal from an adjustable input amplifier may be received by an output amplifier. At step 706, the system may monitor when the default amplification of the adjustable input amplifier is modified. The system may detect, at step 708, whether a modification to the default amplification of the adjustable input amplifier was modified. If such a modification is not detected, at step 714, the audio signal received at step 704 is amplified by applying the default amplification (such as unity gain) of the output amplifier. Alternatively, if such a modification is detected, at step 710, the default amplification of the output amplifier is adjusted by an amount that maintains the predetermined audio console gain between the input and the output. This may be accomplished in a number of ways previously discussed, including by determining the number of decibels which the default amplification of the adjustable input amplifier was modified and adjusting the amplification of the output amplifier by the opposite number of decibels. At step 712, the audio signal received in step 704 is amplified by applying the adjusted amplification of the output amplifier. In either case, the amplified audio signal is output to the audio console output at step 716.

Figure 8:
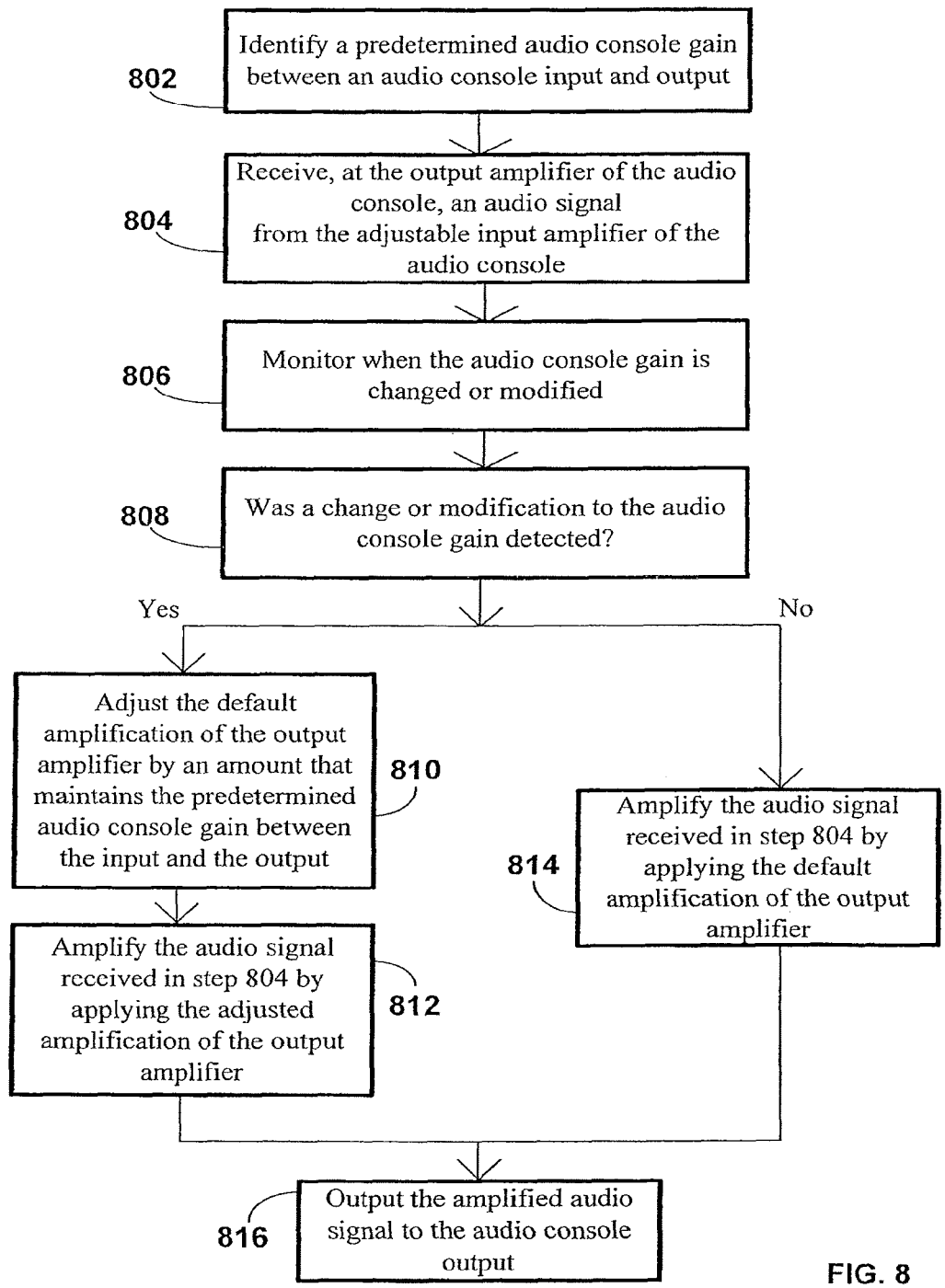
FIG. 8 is an example of how a system may perform output gain stabilization.

FIG. 8 is another example operation of a console system performing output gain stabilization. The process may begin at step 802, where a predetermined audio console gain between an input and an output may be identified. At step 804, an audio signal from an adjustable input amplifier may be received by an output amplifier. At step 806, the system may monitor when the audio console gain is changed or modified. The system may detect, at step 808, whether a change or modification to the default amplification of the adjustable input amplifier was detected. If such a modification is not detected, at step 814, the audio signal received at step 804 is amplified by applying the default amplification (unity gain) of the output amplifier. Alternatively, if such a modification is detected, then at step 810, the default amplification of the output amplifier is adjusted by an amount that maintains, or substantially maintains, the predetermined audio console gain between the input and the output. At step 812, the audio signal received at step 804 is amplified by applying the adjusted amplification of the output amplifier. At step 816, the amplified audio signal is output to the audio console output.

The systems and processes described may be encoded in a signal bearing medium, a computer readable medium such as a memory, programmed within a device such as one or more integrated circuits, and one or more processors or processed by a controller or a computer. If the methods are performed by software, the software may reside in a memory resident to or interfaced to a storage device, synchronizer, a communication interface, or non-volatile or volatile memory in communication with a transmitter. A circuit or electronic device designed to send data to another location. The memory may include an ordered listing of executable instructions for implementing logical functions. A logical function or any system element described may be implemented through optic circuitry, digital circuitry, through source code, through analog circuitry, through an analog source such as an analog electrical, audio, or video signal or a combination. The software may be embodied in any computer-readable or signal-bearing medium, for use by, or in connection with an instruction executable system, apparatus, or device. Such a system may include a computer-based system, a processor-containing system, or another system that may selectively fetch instructions from an instruction executable system, apparatus, or device that may also execute instructions.

A "computer-readable medium," "machine readable medium," may include any non-transitory memory device that includes, stores, software for use by or in connection with an instruction executable system, apparatus, or device. The machine-readable medium may selectively be, but not limited to, an electronic, magnetic, optical, electromagnetic, infrared, or semiconductor system, apparatus or device. A non-exhaustive list of examples of a machine-readable medium would include: a portable magnetic or optical disk, a volatile memory such as a Random Access Memory "RAM", a Read-Only Memory "ROM", or an Erasable Programmable Read-Only Memory (EPROM or Flash memory. A machine-readable medium may also include a non-transitory tangible medium upon which software is stored, as the software may be electronically stored as an image or in another format (e.g., through an optical scan), then compiled, and/or interpreted or otherwise processed.

In an alternative embodiment, dedicated hardware implementations, such as application specific integrated circuits, programmable logic arrays and other hardware devices, can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

An advantage of the described systems may be that the tracking of the gain is done within a single system, and may avoid issues with synchronizing the gain information to other systems, thereby improving the system's reaction time. A further advantage may be that the above-described audio console may not be brand specific, instead allowing the combined use of a mix audio consoles of different providers. Additionally, the system allows a master audio console to share an audio signal with one or more slave consoles without any one console modifying or changing the amplification of one or more channels and thereby modifying or changing the amplification of that channel for the entire chain of consoles.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

I claim:

1. An audio console processing audio signals comprising: at least one input operable to receive an audio signal; an adjustable input amplifier operable to amplify the audio signal received by the at least one input with an adjustable input amplifier gain; a direct out output amplifier operable to receive and process the amplified audio signal amplified by the adjustable input amplifier, where the direct out output amplifier is immediately after the adjustable input amplifier; and a direct out output operable to output the amplified audio signal, where the direct out output amplifier is operable to adjust a gain, applied by the direct out output amplifier to the received amplified audio signal, in response to adjustment of the adjustable input amplifier gain, and where the audio console has an audio console gain between the at least one input and the direct out output, and where the direct out output amplifier is operable to adjust a gain, applied by the direct out output amplifier to the received amplified audio signal, by an amount operable to maintain the audio console gain between the at least one input and the direct out output.

2. The audio console according to claim 1, where the direct out output amplifier is operable to adjust the gain, applied by the direct out output amplifier to the received amplified audio signal, automatically in accordance with adjustment of the adjustable input amplifier gain.

3. The audio console according to claim 1, where the direct out output amplifier is operable to set the gain applied by the direct out output amplifier to unity in response to no adjustment in the adjustable input amplifier.

4. The audio console according to claim 1, where the direct out output is the earliest point in the signal chain of the audio console after the direct out output amplifier, and where the direct out output is operable to output the amplified audio signal from the audio console.

5. The audio console according to claim 1, where the audio console is a digital audio mixing console.

6. The audio console according to claim 1, where the adjustment to the gain applied by the direct out output amplifier is an inverse of the adjustment of the adjustable input amplifier gain.

7. The audio console according to claim 1, where the direct out output amplifier is operable to set the gain applied by the direct out output amplifier to unity according to an adjustment in the adjustable input amplifier.

8. The audio console according to claim 1, where the direct out output amplifier is operable to set the gain applied by the direct out output amplifier to maintain a predefined gain of the audio signal.

9. A console system processing audio signals comprising: a master console comprising: a first input receiving an audio signal; an adjustable input amplifier operable to amplify the audio signal received at the first input with an adjustable input amplifier gain; an output amplifier configured to receive the amplified audio signal from the adjustable input amplifier and process the amplified audio signal; and a first output configured to output the processed audio signal; where the output amplifier is configured to adjust a gain, applied by the output amplifier to the received amplified audio signal, in response to detection of an adjustment of the adjustable input amplifier gain by the output amplifier, where the output amplifier is directly coupled to the adjustable input amplifier, and where the master console has an audio console gain between the first input and the first output, and where the output amplifier is configured to adjust a gain, applied by the output amplifier to the received amplified audio signal, by an amount operable to maintain the audio console gain between the first input and the first output.

10. The console system of claim 9, further comprising a slave console comprising a source input connected to the first output of the master console.

11. The console system of claim 10, where adjustment of the gain applied by the output amplifier is opposite of adjustment of the adjustable input amplifier gain.

12. The console system according to claim 10, where the slave console comprises a slave console output, where the master console comprises a second input and a second output, where the slave console output is connected to the second input of the master console, where the master console comprises a transmission path from the second input to the second output.

13. The console system according to claim 12, where the audio signal is passed from the second input to the second output without processing.

14. The console system according to claim 12, further comprising a stage rack, where an output of the stage rack is provided to the first input of the master console, and where the second output of the master console is provided to an input of the stage rack.

15. The console system according to claim 10, further comprising a hub connected to the first output of the master console, a plurality of slave consoles being connected to the hub.

16. A non-transitory tangible computer readable storage medium having stored therein data representing instructions executable by a programmed processor for amplifying an audio signal in an audio console, the storage medium comprising:
instructions to identify an audio console gain between an input of the audio console and an output of the audio console, where the audio console comprises the input, an adjustable input amplifier, an output amplifier, and the output; and
instructions to adjust an amplification of the output amplifier by an amount operable to maintains the audio console gain between the input and the output, where the output amplifier is immediately after the adjustable input amplifier.

17. The storage medium of claim 16, further comprising:
instructions to detect changes in the audio console gain,
where the instructions to adjust the amplification of the output amplifier by an amount operable to maintain the audio console gain between the input and the output comprise:
instructions to set a gain of the output amplifier to unity in response to no detected change in the audio console gain; and
instructions to adjust the amplification of the output amplifier by an amount that maintains the audio console gain between the input and the output in response to a detected change in the audio console gain.

18. The storage medium of claim 16, further comprising:
instructions to detect a change in an amplification of the adjustable input amplifier; and
instructions to determine a number of decibels which the amplification of the adjustable input amplifier changed, where the instructions to adjust the amplification of the output amplifier by an amount that maintains the audio console gain between the input and the output comprise instructions to adjust the amplification of the output amplifier by the opposite number of decibels which the amplification of the adjustable input amplifier changed in response to a detected change in the amplification of the adjustable input amplifier.

19. A method for processing an audio signal in an audio console, the method comprising: providing the audio console comprising an input, an adjustable input amplifier, a direct out output amplifier, and an output, where the direct out output amplifier is directly coupled to the adjustable input amplifier; receiving an audio signal at the input; amplifying the received audio signal with the adjustable input amplifier; monitoring an adjustment of a gain of the adjustable input amplifier; processing the amplified signal with the direct out output amplifier; adjusting a gain of the direct out output amplifier in response to the adjustment of the gain of the adjustable input amplifier; outputting the received audio signal at the output, subsequent to the adjusting of the gain of the direct out output amplifier, where the audio console has an audio console gain between the input and the output, and adjusting, with the direct out output amplifier, a gain, applied by the direct out output amplifier to the received amplified audio signal, by an amount operable to maintain the audio console gain between the input and the output.

20. The method of claim 19, where adjusting the gain of the direct out output amplifier in response to the adjustment of the gain of the adjustable input amplifier comprises inversely adjusting the gain of the direct out output amplifier in response to the adjustment of the gain of the adjustable input amplifier, maintaining a constant gain between an input and an output.

21. The method of claim 20, further comprising:
amplifying the amplified signal of the adjustable input amplifier by the inversely adjusted gain of the direct out output amplifier in response to the adjustment of the gain of the adjustable input amplifier; and
amplifying the amplified signal of the adjustable input amplifier by a default gain of the direct out output amplifier in response to no adjustment of the gain of the adjustable input amplifier.

* * * * *